United States Patent
Bono et al.

(10) Patent No.: US 9,735,139 B2
(45) Date of Patent: Aug. 15, 2017

(54) OPTOELECTRONIC DEVICE COMPRISING A LIGHT-EMITTING DIODE

(71) Applicant: Commissariat à l'Énergie Atomique et aux Énergies Alternatives, Paris (FR)

(72) Inventors: Hubert Bono, Grenoble (FR); Ivan-Christophe Robin, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/074,980

(22) Filed: Mar. 18, 2016

(65) Prior Publication Data

US 2016/0276329 A1    Sep. 22, 2016

(30) Foreign Application Priority Data

Mar. 20, 2015  (FR) ..................................... 15 52348

(51) Int. Cl.
*H01L 21/04* (2006.01)
*H01L 25/00* (2006.01)
(Continued)

(52) U.S. Cl.
CPC .......... *H01L 25/50* (2013.01); *H01L 25/0756* (2013.01); *H01L 27/153* (2013.01);
(Continued)

(58) Field of Classification Search
CPC ... H01L 2924/181; H01L 33/60; H01L 33/58; H01L 2924/12041; H01L 2924/14; H01L 31/048; H01L 21/56
(Continued)

(56) References Cited

U.S. PATENT DOCUMENTS 6,477,286 B1 * 11/2002 Ouchi ...................... G02B 6/10
257/433
2009/0103297 A1    4/2009 Bogner et al.
(Continued)

FOREIGN PATENT DOCUMENTS

WO    WO 2011/108664 A1    9/2011
WO    WO 2012/164437 A2    12/2012

OTHER PUBLICATIONS

European Search Report for Application No. EP 16160762.7 dated Aug. 18, 2016.
(Continued)

*Primary Examiner* — Marc Armand
*Assistant Examiner* — Sarah Salerno
(74) *Attorney, Agent, or Firm* — Wolf, Greenfield & Sacks, P.C.

(57) ABSTRACT

The invention relates to a method of manufacturing optoelectronic devices including light-emitting diodes, including the steps of:
a) forming a first integrated circuit chip including light-emitting diodes;
b) bonding a second integrated chip to a first surface of the first chip;
c) decreasing the thickness of the first chip on the side opposite to the first surface to form a second surface opposite to the first surface;
d) bonding, to the second surface, a cap including a silicon wafer provided with recesses opposite the light-emitting diodes;
e) decreasing the thickness of the second chip;
f) decreasing the thickness of the silicon wafer before step d) or after step e), each recess being filled with a photoluminescent material; and
(Continued)

g) sawing the structure obtained at step f) into a plurality of separate optoelectronic devices.

7 Claims, 9 Drawing Sheets

(51) Int. Cl.
    *H01L 27/15*     (2006.01)
    *H01L 33/48*     (2010.01)
    *H01L 33/50*     (2010.01)
    *H01L 33/60*     (2010.01)
    *H01L 33/62*     (2010.01)
    *H01L 33/64*     (2010.01)
    *H01L 25/075*     (2006.01)
    *H01L 33/20*     (2010.01)
    *H01L 33/58*     (2010.01)
    *H01L 33/00*     (2010.01)

(52) U.S. Cl.
CPC ............ *H01L 33/20* (2013.01); *H01L 33/486* (2013.01); *H01L 33/505* (2013.01); *H01L 33/507* (2013.01); *H01L 33/58* (2013.01); *H01L 33/60* (2013.01); *H01L 33/62* (2013.01); *H01L 33/641* (2013.01); *H01L 33/642* (2013.01); *H01L 33/644* (2013.01); *H01L 33/0079* (2013.01); *H01L 33/0095* (2013.01); *H01L 33/508* (2013.01); *H01L 2933/0033* (2013.01); *H01L 2933/0041* (2013.01); *H01L 2933/0058* (2013.01); *H01L 2933/0066* (2013.01)

(58) Field of Classification Search
USPC .......................................... 257/98, 99, 100
See application file for complete search history.

(56) References Cited

U.S. PATENT DOCUMENTS

2010/0244065 A1     9/2010   Butterworth
2015/0060915 A1     3/2015   Lee

OTHER PUBLICATIONS

French Search Report, dated Jan. 27, 2016, from French Application No. 15/52348.

* cited by examiner

US 9,735,139 B2

OPTOELECTRONIC DEVICE COMPRISING A LIGHT-EMITTING DIODE

CROSS-REFERENCE TO THE RELATED APPLICATION

This application claims the priority benefit of French patent application No. 15/52348, filed on Mar. 20, 2015, the content of which is hereby incorporated by reference in its entirety to the maximum extent allowable by law.

BACKGROUND

The present disclosure relates to an optoelectronic device comprising at least one light-emitting diode, particularly for illumination systems, and to a method of manufacturing the same.

DISCUSSION OF THE RELATED ART

Generally, the manufacturing of an optoelectronic device comprising a light-emitting diode comprises manufacturing light-emitting diodes on a substrate which is then sawn into individual chips. Each individual chip is then assembled on a support. Different elements may further be bonded to the individual chip or support to carry out various functions, including, in particular, the transformation of the electromagnetic radiation emitted by the light-emitting diode into a radiation having the desired spectrum, the removing of the heat generated by the light-emitting diode, the electric control of the light-emitting diode, the electric connection of the optoelectronic device to an external system, and the protection of the device from the outer environment.

The various known methods of manufacturing, encapsulating, and assembling light-emitting diodes imply implementing a very large number of steps, some of which are complex, particularly implying chip transfers and the use of multiple handles.

SUMMARY

An object of an embodiment aims at overcoming all or part of the disadvantages of the previously-described optoelectronic devices comprising light-emitting diodes and of their manufacturing methods.

Another object of an embodiment is to perform a collective manufacturing and encapsulation of the light-emitting diodes by a method which is particularly simple to implement and which makes sure that the light-emitting diodes can be assembled in optimal heat dissipation conditions.

Thus, an embodiment provides a method of manufacturing optoelectronic devices comprising light-emitting diodes, comprising the steps of:

a) forming a first integrated circuit chip comprising light-emitting diodes;

b) bonding a second integrated chip to a first surface of the first integrated circuit chip;

c) decreasing the thickness of the first integrated circuit chip on the side opposite to the first surface to form a second surface opposite to the first surface, the first integrated circuit chip having, after step c), a first thickness in the range from 100 nm to 50 µm;

d) bonding, to the second surface, a cap comprising a silicon wafer provided with recesses opposite the light-emitting diodes, the cap further optionally comprising a transparent plate bonded to the silicon wafer;

e) decreasing the thickness of the second integrated circuit chip, the second integrated circuit chip having a second thickness smaller than or equal to 150 µm after step e);

f) decreasing the thickness of the silicon wafer before step d) or after step e), the thickness of the cap, optionally comprising the transparent plate, being greater than or equal to 100 µm after step f), each recess being filled with a photoluminescent material; and g) sawing the structure obtained at step f) into a plurality of separate optoelectronic devices each comprising at least one of the light-emitting diodes.

According to an embodiment, the light-emitting diodes have a mesa structure.

According to an embodiment, the recesses are filled with the photoluminescent material before step d).

According to an embodiment, the recesses are blind before step f), and are through after step f), the method further comprising the step of filling each recess with the photoluminescent material after step f).

According to an embodiment, steps b), c), and d) are successive.

According to an embodiment, step a) comprises the forming of the light-emitting diodes on a substrate and step c) comprises the partial or total removal of the substrate.

According to an embodiment, the second integrated circuit chip is bonded to the first integrated circuit chip by direct bonding and is electrically connected to the light-emitting diodes.

An embodiment also provides an optoelectronic device comprising:

a first integrated circuit chip comprising first and second opposite surfaces having a thickness in the range from 100 nm to 50 µm and comprising at least one light-emitting diode;

a cap bonded to the first surface, the cap comprising at least one through recess delimited by a silicon frame and containing a block of a photoluminescent material, the cap further optionally comprising a transparent plate, the thickness of the cap, optionally comprising the transparent plate, being greater than or equal to 100 µm; and a second integrated circuit chip bonded to the second surface and having a thickness smaller than or equal to 150 µm.

According to an embodiment, the light-emitting diode has a mesa structure.

According to an embodiment, the photoluminescent block is laterally surrounded with a reflective wall.

The foregoing and other features and advantages will be discussed in detail in the following non-limiting description of specific embodiments in connection with the accompanying drawings.

DETAILED DESCRIPTION

Figure 1:
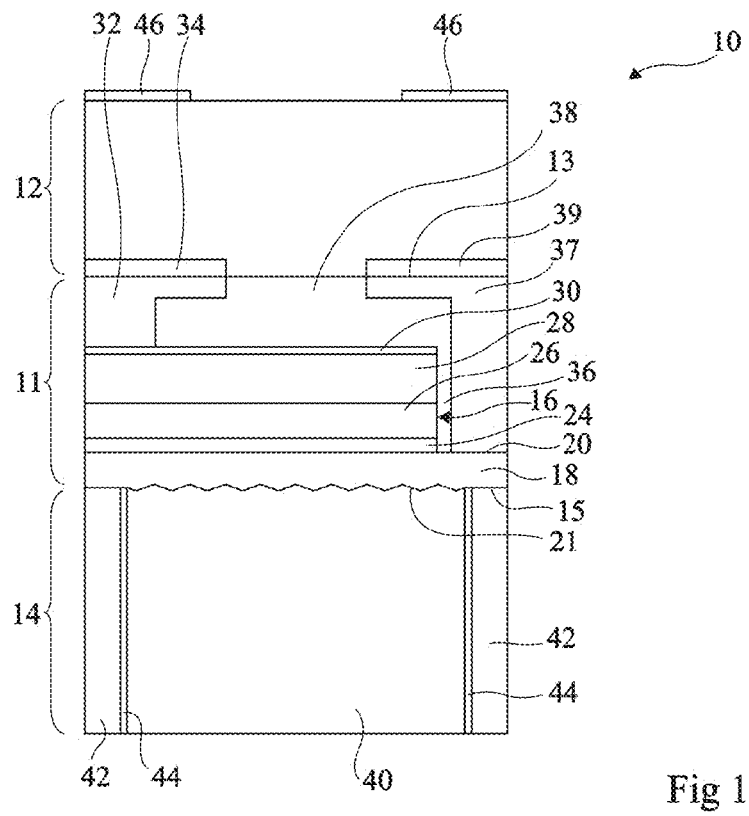
FIGS. 1 to 7 are partial simplified cross-section views of embodiments of an optoelectronic device.

For clarity, the same elements have been designated with the same reference numerals in the various drawings and, further, as usual in the representation of integrated circuits, the various drawings are not to scale. Further, in the following description, expressions "substantially", "around", and "approximately" mean "to within 10%". Further, only those elements which are useful to the understanding of the present description have been shown and will be described. In particular, the means for biasing a light-emitting diode of an optoelectronic device are well known and will not be described.

In the following description, "active area" of a light-emitting diode designates the region of the light-emitting diode from which most of the electromagnetic radiation provided by the light-emitting diode is emitted.

FIG. 1 shows an embodiment of an optoelectronic device 10 comprising a light-emitting diode.

Device 10 comprises a first integrated circuit chip 11, a second integrated circuit chip 12 bonded to a first surface 13 of chip 11, and a cap 14 bonded to a second surface 15 of chip 11, opposite to first surface 13. In operation, device 10 is capable of emitting an electromagnetic radiation from optoelectronic chip 11 through cap 14, that is, downwards in FIG. 1.

First integrated circuit chip 11 comprises at least one light-emitting diode 16 and is called optoelectronic circuit or optoelectronic chip in the following description. In FIG. 1, the shown optoelectronic device comprises a single light-emitting diode 16. Second integrated circuit chip 12 provides the connection between optoelectronic chip 11 and a support, not shown, of the device arranged on the side of second integrated circuit chip 12 opposite to that having optoelectronic chip 11 assembled thereon. Second integrated circuit chip 12 may comprise electronic components, not shown, particularly transistors, used to control or protect light-emitting diode 16 of first integrated circuit chip 11. Second integrated chip 12 is called interposer or control chip in the following description. Optoelectronic chip is bonded to interposer 12. According to the type of bonding, inserts may possibly be present between optoelectronic chip 11 and interposer 12.

The thickness of optoelectronic chip 11 may be in the range from 100 nm to 50 µm, preferably from 1 µm to 30 µm, for example, approximately 10 µm. The thickness of interposer 12 is smaller than or equal to 150 µm, preferably in the range from 1 µm to 150 µm, more preferably still from 10 µm to 100 µm, for example, approximately 30 µm. Cap 14 may comprise a transparent plate, for example, a glass plate. The thickness of cap 14, comprising the possible transparent plate, is greater than or equal to 100 µm.

According to an embodiment, light-emitting diode 16 comprises a stack of semiconductor layers each mainly containing at least one III-V compound. According to a first example, light-emitting diodes 16 have the structure described in patent application EP2960940 which is incorporated herein by reference. According to a second example, light-emitting diode 16 has the structure described in the publication entitled "III-nitride micro-emitter arrays: development and applications" of Z. Y. Fan, J. Y. Lin, and H. X. Jiang (Journal of Physics D: Applied Physics, volume 41, number 9, pages 094001, 2008). According to an embodiment, light-emitting diode 16 has a two-dimensional structure, also called mesa structure, since it is formed by a stack of substantially planar semiconductor layers and comprises an active layer which protrudes above the substrate after a step of etching its sides.

According to an embodiment optoelectronic chip 11 comprises a semiconductor layer 18 delimited by surface 15 and an opposite surface 20. Light-emitting diode 16 rests on surface 20 of layer 18. Layer 18 is for example a heavily-doped semiconductor layer of a first conductivity type, for example, type N. Layer 18 is for example made of a III-V compound, especially a III-N compound. Examples of III-N compounds are GaN, AlN, InN, InGaN, AlGaN, or AlInGaN. The thickness of layer 18 may be in the range from 500 nm to 50 µm, preferably from 1 µm to 6 µm. Surface 15 may comprise raised patterns 21 which improve the extraction of the light emitted by light-emitting diode 16. The maximum thickness of raised patterns 21 may be greater than 500 nm. The pattern density may be greater than $10^7/cm^2$.

Light-emitting diode 16 comprises a stack of semiconductor layer portions comprising, from bottom to top in FIG. 1:

a doped semiconductor portion 24 of the first conductivity type, for example, N-type doped, in contact with surface 20 of layer 18;

an active area 26; and a doped semiconductor portion 28 of a second conductivity type opposite to the first conductivity type, for example, P-type doped.

According to another embodiment, semiconductor layer 18 may be absent.

According to an embodiment, active area 26 and semiconductor portions 24 and 28 each mainly comprise at least one III-V compound, particularly a III-N compound. Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions. Active area 26 and semiconductor portions 24 and 28 may each comprise a dopant.

Active area 26 may comprise a single quantum well. It may then comprise a semiconductor material different from the semiconductor material forming semiconductor portions 24 and 28 and having a bandgap smaller than that of semiconductor portions 24 and 28. Active area 26 may comprise multiple quantum wells. It then comprises a stack of semiconductor layers forming an alternation of quantum wells and of barrier layers.

The thickness of semiconductor portion 24 may be in the range from 0.1 µm to 20 µm. The thickness of semiconductor portion 28 may be in the range from 50 nm to 20 µm. The thickness of active area 26 may be in the range from 10 nm to 500 nm. The width of light-emitting diode 16 may be smaller than 30 µm, preferably from 5 µm to 30 µm.

For each light-emitting diode 16, an electrically-conductive portion 30 covers semiconductor portion 28. Conductive portions 30 are for example made of aluminum or of silver. The thickness of each conductive portion 30 is for example in the range from 3 nm to 400 nm. Optoelectronic chip 11 comprises a connection element 32 which electrically connects conductive portion 30 to interposer 12. Interposer 12 comprises a conductive portion 34 in contact with connection element 32.

The lateral sides of semiconductor portion 28, of active area 26, and of at least a portion of semiconductor portion 24 are covered with an insulating portion 36. The thickness of insulating portion 36 may be selected so that insulating portion 36 has an acceptable leakage current.

Optoelectronic chip 11 comprises a connection element 37 which electrically connects layer 18 to a conductive portion 39 of interposer 12. Connection element 37 is electrically insulated from semiconductor portion 28 and from active area 26 by insulating portion 36. Connection element 37 is in contact with surface 20 of layer 18. Connection element 37 may, further, be in contact with a portion of semiconductor portion 24. Connection elements 32 and 37 are electrically insulated from one another by an insulating region 38 which continues insulating portion 36. Connection elements 32, 37 and insulating region 38 delimit surface 13 of optoelectronic chip 11.

Cap 14 comprises at least one photoluminescent block 40 on surface 15 of layer 18 opposite light-emitting diode 16, a single photoluminescent block 40 being shown in FIG. 1. Photoluminescent block 40 is surrounded with a frame 42 resting on surface 15 of layer 18. Frame 42 may be made of an insulating, semiconductor, or conductive material. As an example, frame 42 is made of silicon. The thickness of photoluminescent block 40 is in the range from 50 μm to 200 μm, preferably in the range from 75 μm to 150 μm, for example, approximately 100 μm. The width of photoluminescent block 40 is in the range from 20 μm to 200 μm, preferably in the range from 75 μm to 150 μm, for example, approximately 100 μm. Photoluminescent block 40 may comprise a photoluminescent material comprising, for example, a matrix having phosphors dispersed therein, for example, yttrium aluminium garnet (YAG) activated by the trivalent cerium ion, also called YAG:Ce or YAG:Ce3+.

According to an embodiment, the lateral walls of frame 42 directed towards photoluminescent block 40 are covered with a coating 44 capable of reflecting the radiation emitted by photoluminescent blocks 40. Coating 44 is, for example, an aluminum film having a thickness in the range from 10 nm to 2 μm.

Preferably, interposer 12 is mainly made of a good heat conductor. According to an embodiment, interposer 12 mainly comprises a semiconductor substrate. Interposer 12 may comprise conductive portions 46 on the side opposite to optoelectronic chip 11 to allow a mechanical and/or electric connection of interposer 12 to a support, not shown. According to an embodiment, interposer 12 comprises a connection element, not shown, connecting conductive portion 34 to one of conductive portions 46 and a connection element, not shown, connecting conductive portion 34 to another one of conductive portions 46. According to an embodiment, interposer 12 comprises a semiconductor substrate and the connection elements comprise conductive vias, insulated from the substrate, and crossing the substrate across its entire thickness. According to another embodiment, interposer 12 comprises electronic components, particularly transistors, to carry out specific functions, for example, the control of light-emitting diode 16 or the protection of light-emitting diode 16 against electrostatic discharges.

Figure 2:
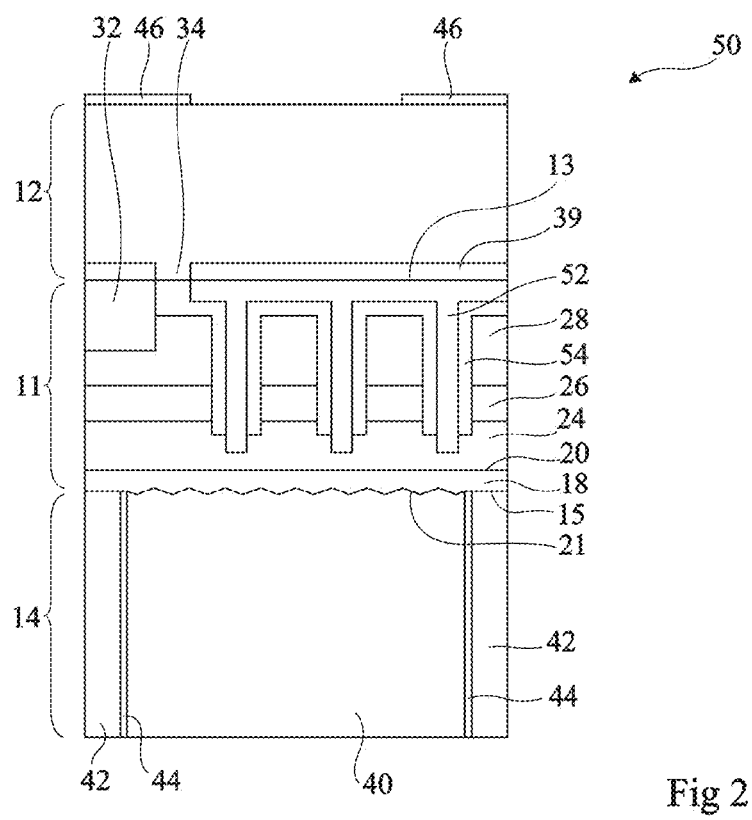

FIG. 2 shows another embodiment of an optoelectronic device 50 where connection element 37 is replaced with conductive fingers 52, three fingers 52 being shown in FIG. 2, which extend through semiconductor portion 28, active layer 26, and a portion of semiconductor portion 24. Each finger 52 is surrounded with an insulating sheath 54 which electrically insulates it from semiconductor portion 28 and from active area 26. The end of each finger 52 is in contact with semiconductor portion 24.

Figure 3:
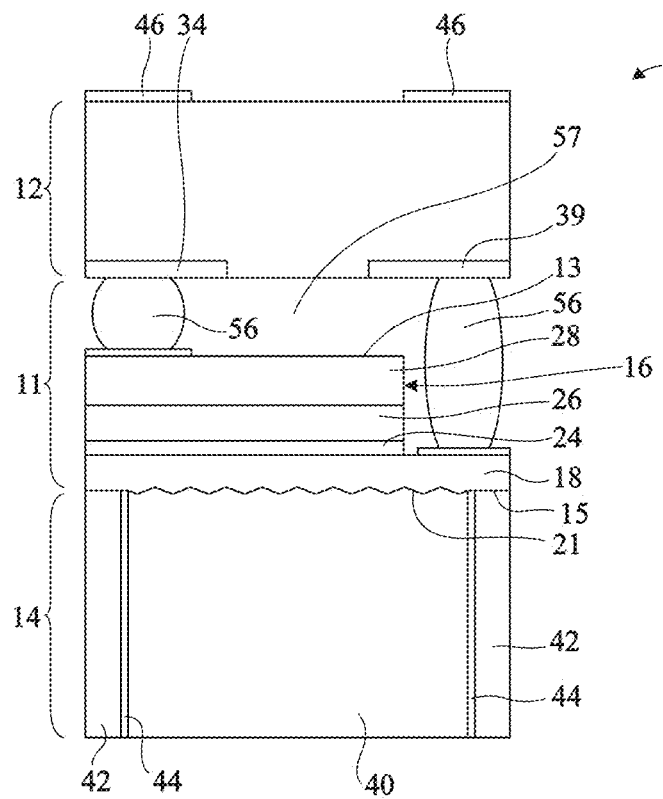

FIG. 3 shows another embodiment of an optoelectronic device 55 where the connection between optoelectronic chip 11 and interposer 12 is achieved by electrically conductive balls 56. Preferably, interstice 57 between optoelectronic chip 11 and interposer 12 is further filled with an electrically-insulating material which is a good heat conductor. The filling material may be graphite or diamond powder. Preferably, the maximum thickness of interstice 57 is smaller than 5 μm, preferably smaller than 2 μm.

In the previously-described embodiments, the optoelectronic chip comprises a single light-emitting diode. As a variation, the optoelectronic device may comprise a plurality of light-emitting diodes which may be connected in series and/or in parallel.

Figure 4:
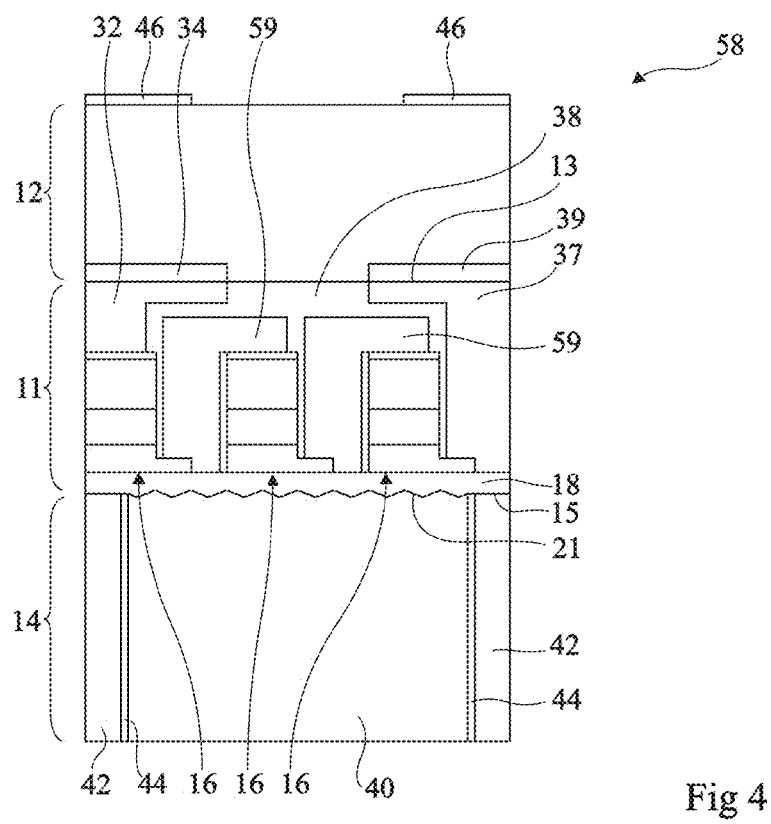
Figure 5:
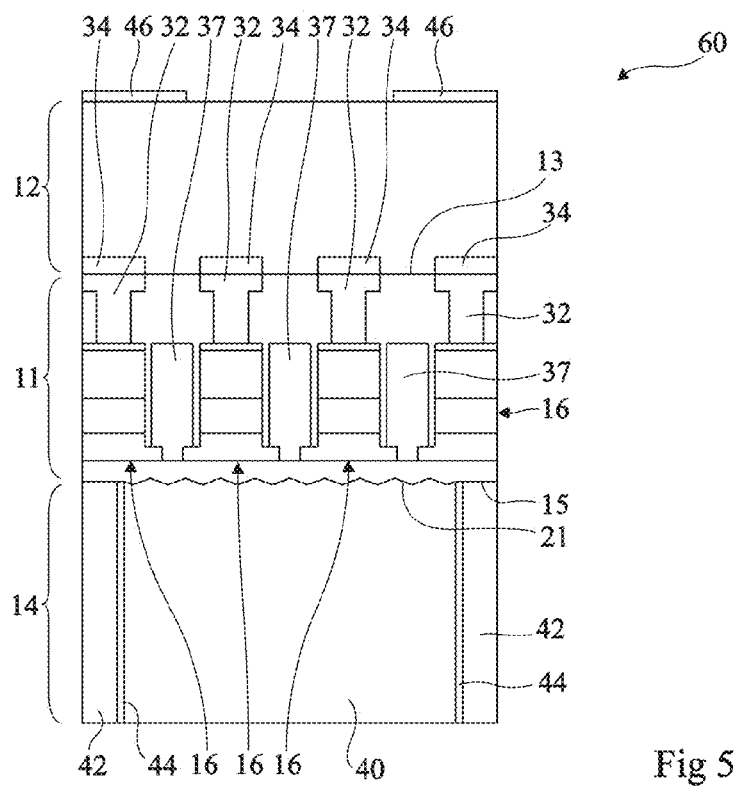

FIGS. 4 and 5 illustrate embodiments where the optoelectronic device comprises a plurality of light-emitting diodes 16. FIG. 4 shows an embodiment of an optoelectronic device 58 comprising three series-connected light-emitting diodes 16, additional connection elements 59 enabling to connect together two adjacent light-emitting diodes 16. FIG. 5 shows another embodiment of an optoelectronic device 60 comprising four light-emitting diodes 16 connected in parallel. In FIG. 5, the conductive portions 39 associated with each light-emitting diode 16 are not shown.

Figure 6:
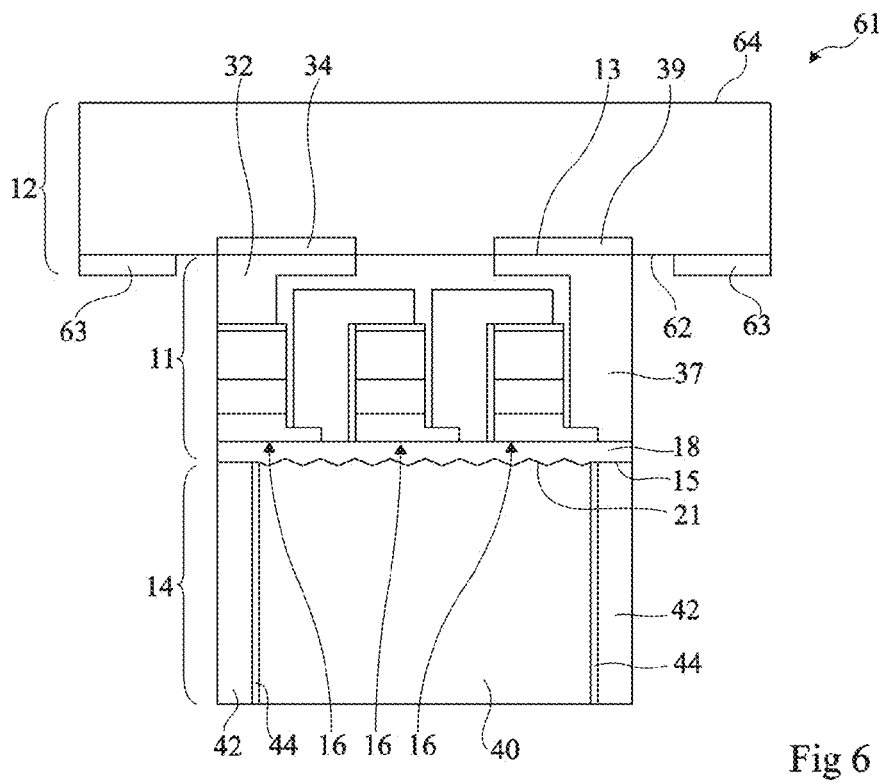

FIG. 6 shows another embodiment of an optoelectronic device 61 where the lateral dimensions of interposer 12 are larger than those of optoelectronic chip 11. The electric connection of interposer 12 to another electronic device, for example, according to a wire connection, may then be performed on surface 62 of the interposer in contact with surface 13 of optoelectronic chip 11. In FIG. 6, two conductive portions 63, which may be used for a wire electric connection, have been shown on surface 62. This embodiment advantageously enables to bond the interposer to the entire surface 64 opposite to surface 62 on a heat sink and thus improve the removal of the heat generated by optoelectronic chip 11 via interposer 12.

Figure 7:
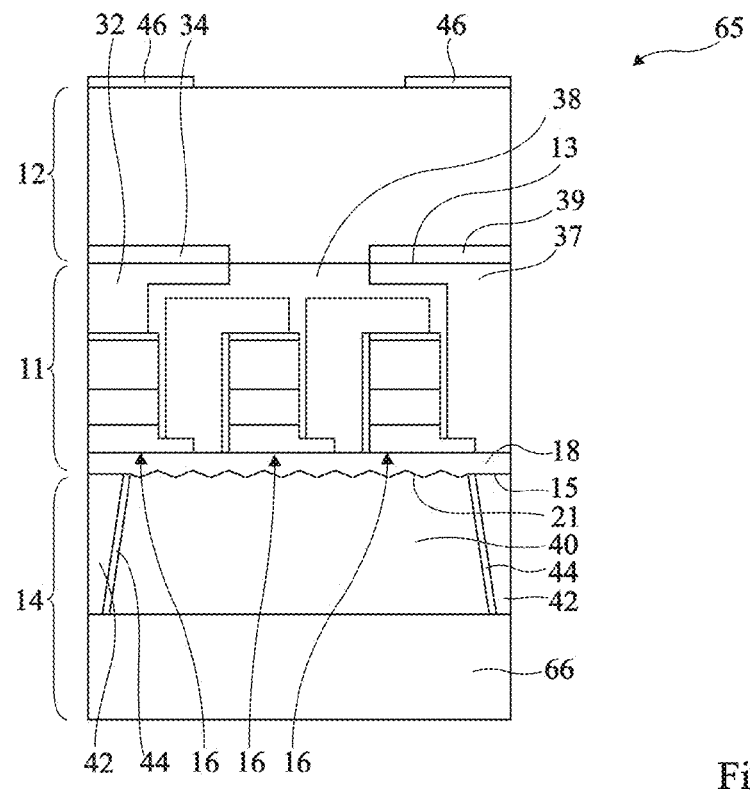

FIG. 7 shows another embodiment of an optoelectronic device 65 where cap 14 comprises a transparent plate 66, for example, a glass plate bonded to frame 42, photoluminescent block 40 being located between optoelectronic chip 11 and transparent plate 66. The thickness of cap 14 comprising transparent plate 66 is greater than or equal to 100 μm, and preferably greater than 200 μm, for example, approximately 500 μm. In FIG. 7, the lateral walls of frame 42, directed towards photoluminescent block 40, are inclined to improve the reflection of the light provided by light-emitting diodes 16 to the outside of optoelectronic device 65.

Figure 8A:
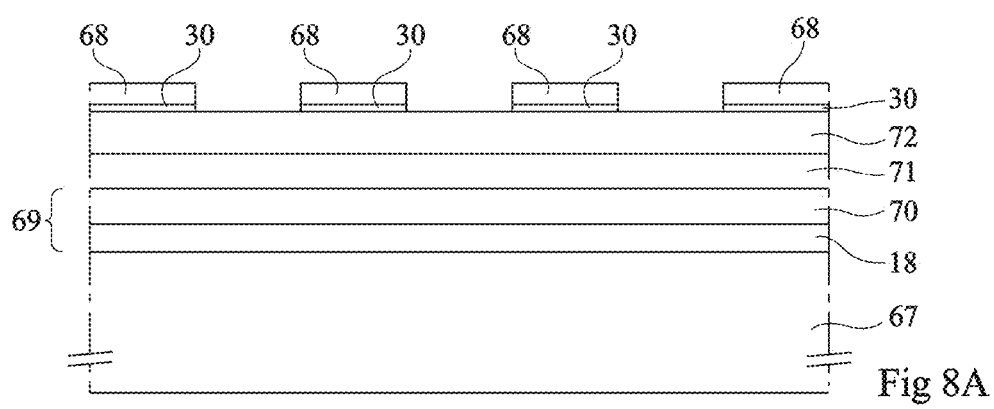
FIGS. 8A to 8N are partial simplified cross-section views of structures obtained at successive steps of another embodiment of a method of manufacturing the optoelectronic device shown in FIG. 1.
Figure 8B:
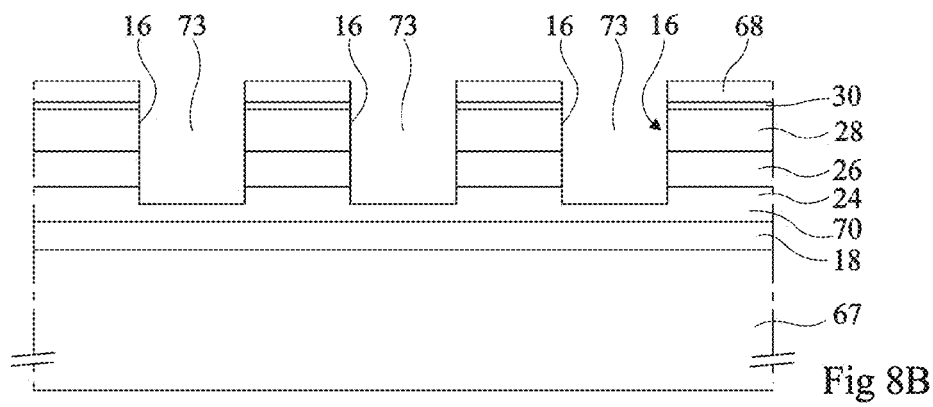
Figure 8C:
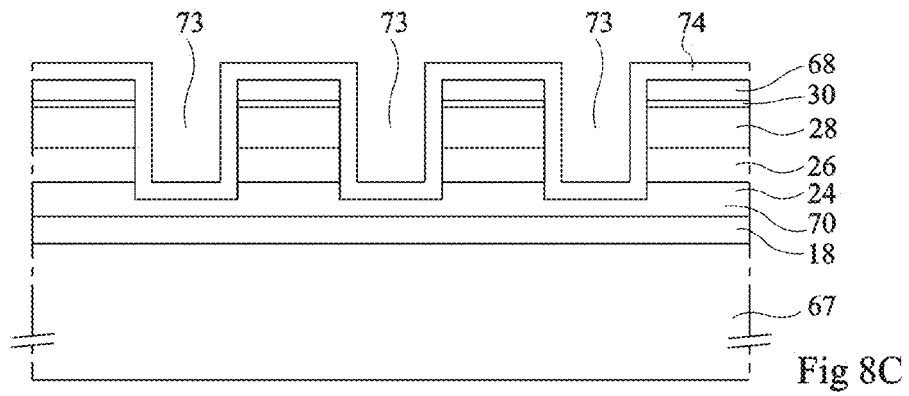
Figure 8D:
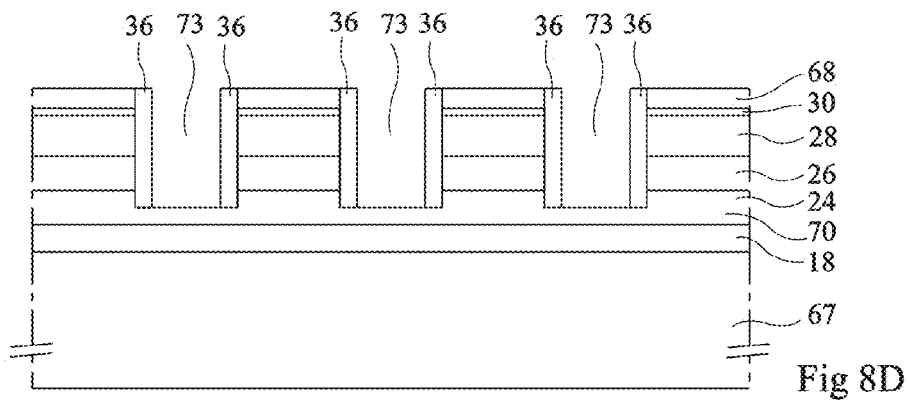
Figure 8E:
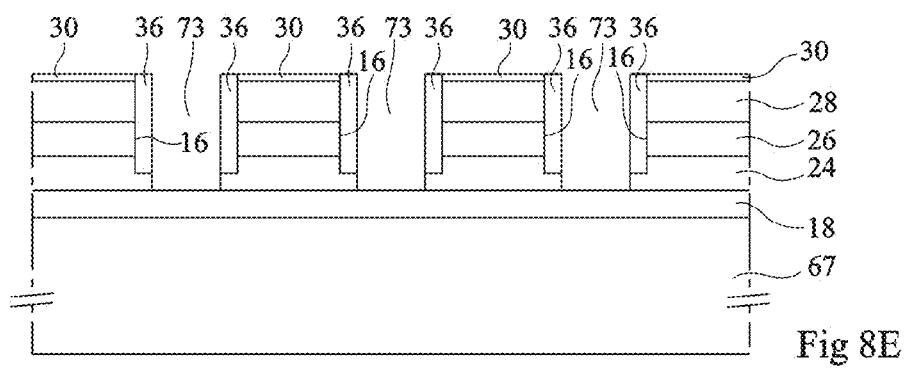
Figure 8F:
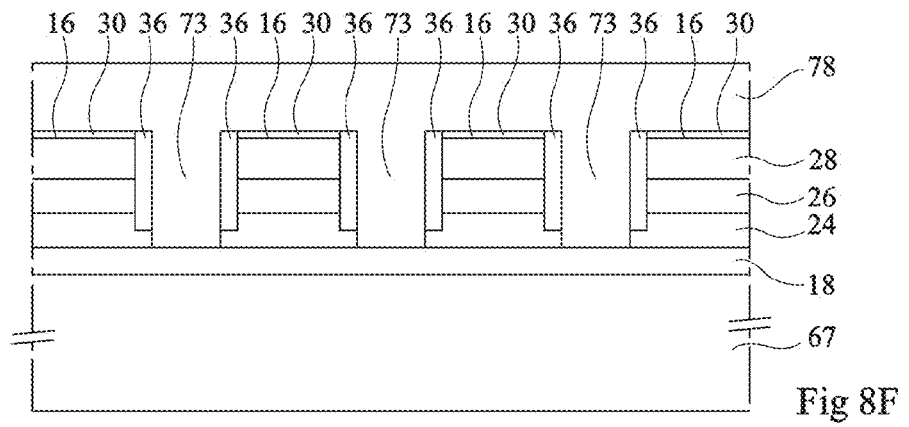
Figure 8G:
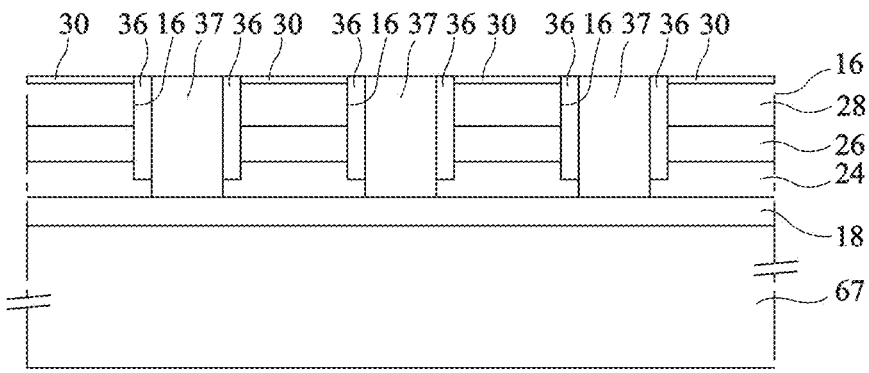
Figure 8H:
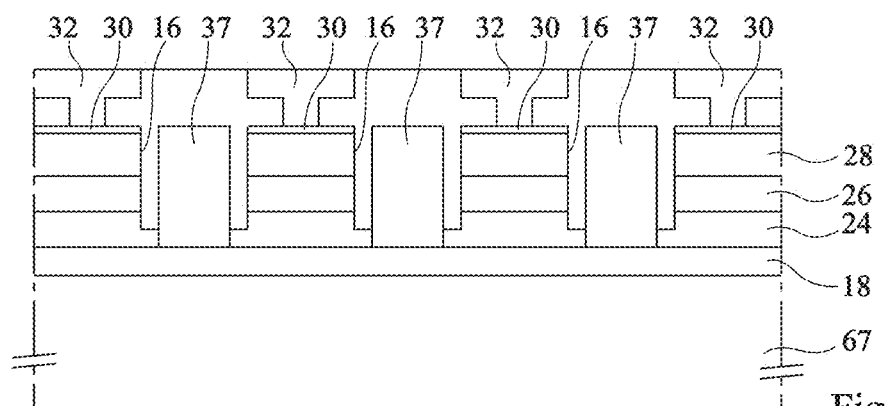
Figure 8I:
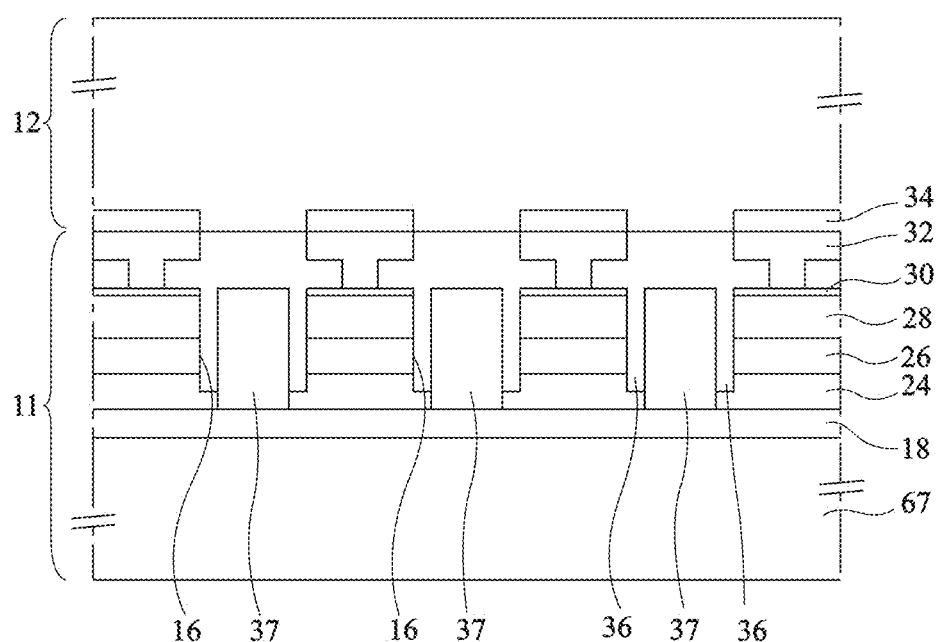
Figure 8J:
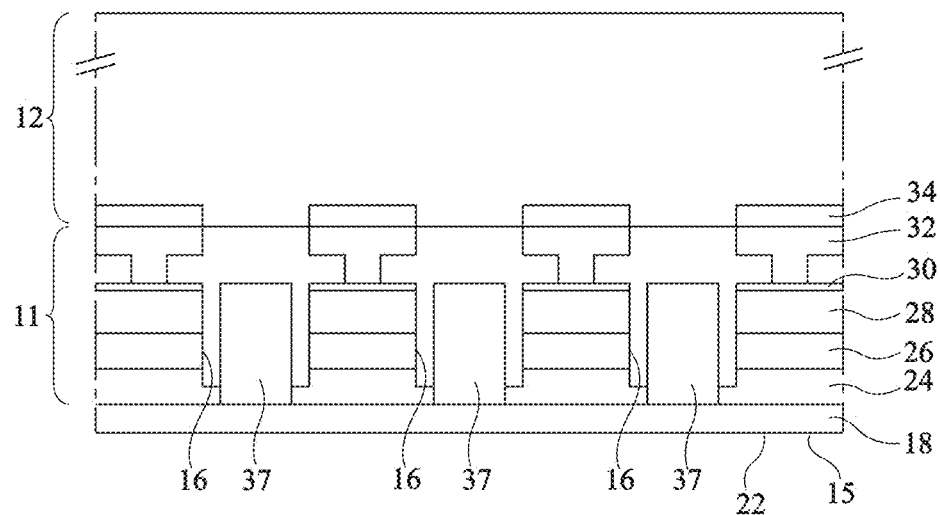
Figure 8K:
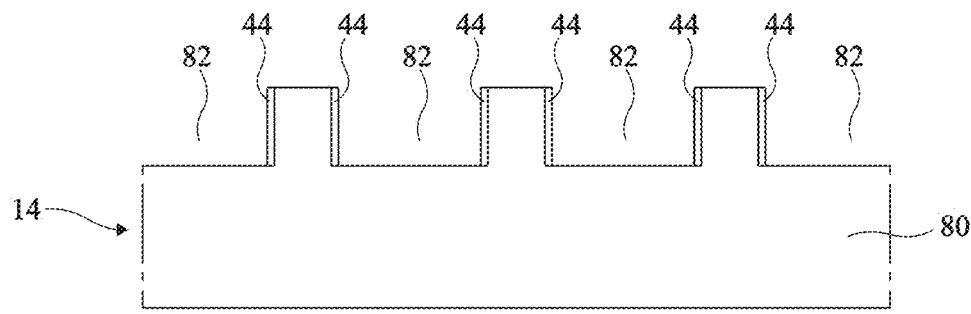
Figure 8L:
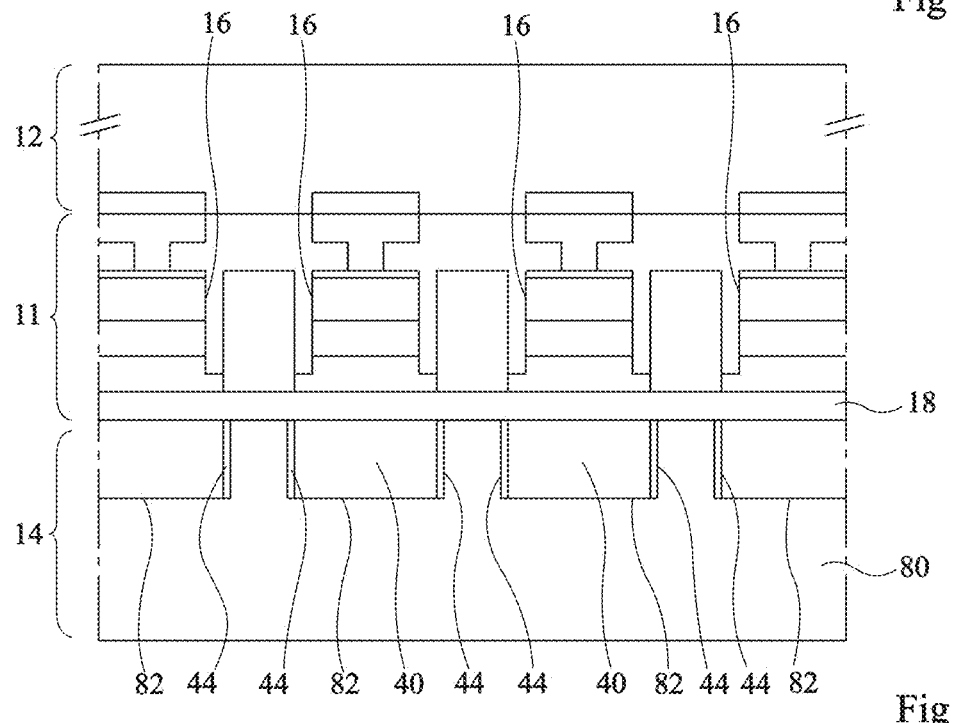
Figure 8M:
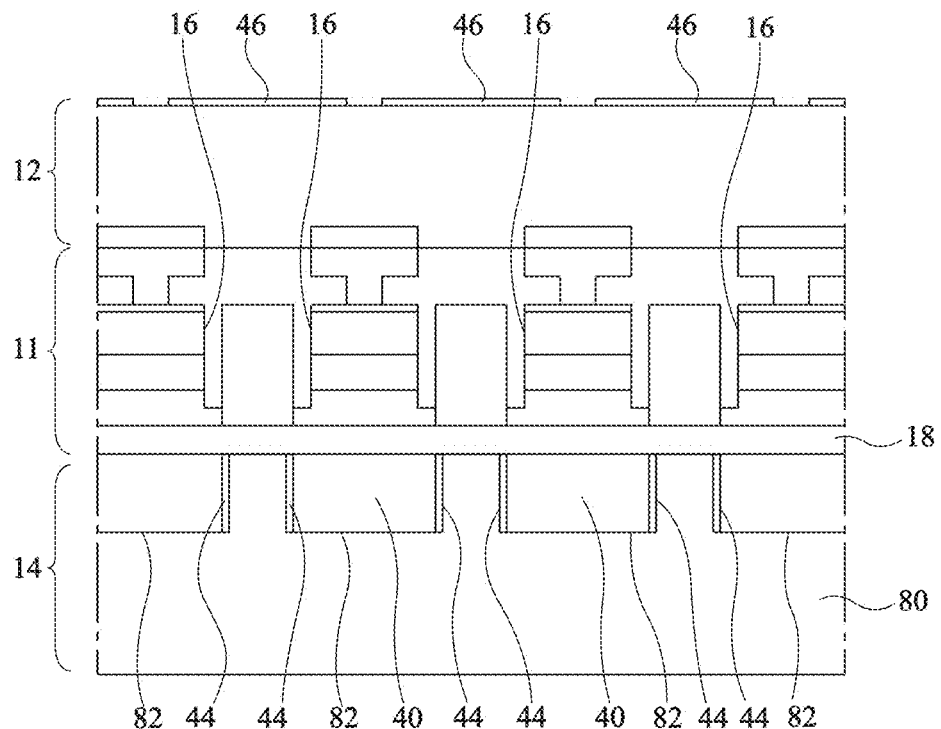
Figure 8N:
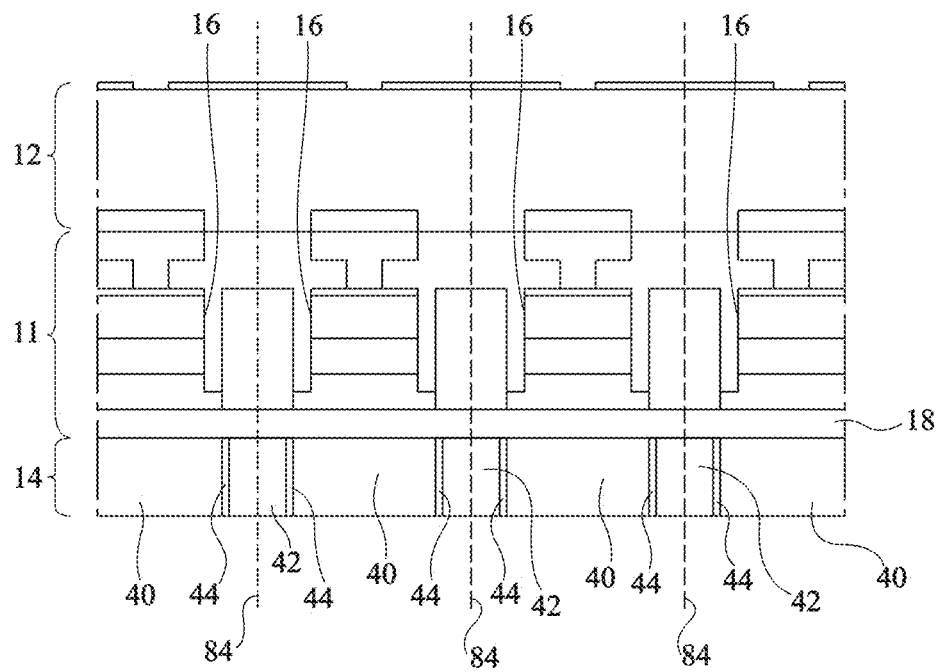

FIGS. 8A to 8N illustrate an embodiment of a method of manufacturing optoelectronic device 10 shown in FIG. 1 where the light-emitting diode forming method corresponds to that described in patent application FR14/50077, which is incorporated herein by reference.

FIG. 8A shows the structure obtained after having formed on substrate 67 a stack of semiconductor layers from which a plurality of light-emitting diodes 16 will be formed, conductive portions 30 on the stack and dielectric portions 68 on conductive portions 30. Substrate 67 may correspond to a one-piece structure or correspond to a layer covering a support made of another material, for example, glass or metal. The substrate for example is a semiconductor substrate such as a substrate made of silicon, of germanium, of silicon carbide, of a III-V compound, such as GaN or GaAs, of a II-VI compound, such as ZnO. Preferably, substrate 67 is made of silicon, particularly of single-crystal silicon or polysilicon. Substrate 67 may be an insulating substrate, for example, a sapphire substrate. The initial thickness of optoelectronic chip 11 is in the range from 200 μm to 2 mm.

The stack comprises, from bottom to top in FIG. 8A: an N-type doped semiconductor layer 69, for example, based on GaN, which comprises a first more heavily-doped portion forming semiconductor layer 18, covering substrate 67, and covered with a less heavily-doped portion forming an N− doped semiconductor layer 70. As a variation, the two layers 18 and 70 may correspond to two layers of different materials. As an example, layer 18 may be based on GaN and layer 70 may be based on InGaN. Further, whether the two layers 18 and 70 correspond to two layers of different materials or to a single layer of a same material, the doping levels of the two layers 18 and 70 may be similar or not;

active layers 71 corresponding to an alternated stack of one or a plurality of quantum well emissive layers, for example, based on InGaN, and of barrier layers, for example, based on GaN; and a P-type doped semiconductor layer 72, for example, made of GaN.

Conductive portions 30 are for example formed by a deposition of a layer of electrically-conductive material, for example, aluminum or silver, followed by a lithography and by an etching.

Conductive portions 30 and dielectric portions 68 each have a shape and dimensions, in the plane of the upper surface of semiconductor layer 72 on which they are formed, substantially similar to those desired for light-emitting diodes 16, for example a disk-shaped cross-section.

FIG. 8B shows the structure obtained after having etched semiconductor layer 72, active layers 71, and a first portion of semiconductor layer 70 according to the pattern defined by dielectric portions 67, forming, for each light-emitting diode 16, a mesa structure, for example, of cylindrical shape, comprising active area 26 arranged between semiconductor portions 24 and 28. This etching is stopped at a depth level located in semiconductor layer 70 so that a portion of layer 70 is kept at the bottom of each of the etched areas of the stack. The etch step forms empty spaces 73 between light-emitting diodes 16. The implemented etching is a dry etching, for example, via a Cl2-based plasma or a reactive ion etching (RIE). The minimum distance between two light-emitting diodes is preferably greater than 15 μm, preferably greater than or equal to 20 μm.

FIG. 8C shows the structure obtained after having conformally deposited a dielectric layer 74, for example, based on SiN, for example in the range from approximately 3 nm to 100 nm, on dielectric portions 68 and along the walls of empty spaces 73, and thus particularly covering the lateral walls of conductive portions 30, of semiconductor portions 28, of active areas 26, and of part of semiconductor portions 24.

FIG. 8D shows the structure obtained after having performed an anisotropic etching, for example, a dry etching, to remove the portions of dielectric layer 74 located at the bottom of empty spaces 73 and on dielectric portions 68. Dielectric portions 36 are thus obtained.

FIG. 8E shows the structure obtained after having etched the rest of semiconductor layer 70 at the bottom of empty spaces 73 all the way to semiconductor layer 18, after having etched dielectric portions 68.

FIG. 8F shows the structure obtained after having deposited an electrically-conductive material 78 which fills empty spaces 73 and covers light-emitting diodes 16. As an example, conductive material 78 is formed by the conformal deposition of a first titanium layer having a thickness for example equal to approximately 10 nm, followed by a deposition of a second aluminum layer to totally fill empty spaces 73. The maximum thickness of conductive material 78 between the bottom of empty spaces 73, in contact with semiconductor layer 18, and the upper surface of conductive material 78 is, for example, equal to approximately 1 μm.

FIG. 8G shows the structure obtained after having performed a planarization step, such as a chem.-mech. polishing (CMP), and/or an etching step, such as a RIE etching, of electrically-conductive material 78 until it reaches the upper surfaces of conductive portions 30 and of dielectric portions 36. The remaining portions of the conductive material arranged between light-emitting diodes 16 correspond to connection elements 37.

FIG. 8H shows the structure obtained after having formed connection elements 32 and 37.

FIG. 8I shows the structure obtained after having bonded interposer 12 to optoelectronic chip 11 on the side of connection elements 32. The initial thickness of interposer 12 is greater than or equal to 100 μm, for example, in the range from 100 μm to 10 cm. The bonding of interposer 12 to optoelectronic chip 11 may be performed by direct bonding, without using inserts such as connection microballs. The direct bonding may comprise a direct metal-to-metal bonding of metal areas 32 of optoelectronic chip 11 and of metal areas 34 of interposer 12 and a dielectric-to-dielectric bonding of the dielectric areas at the surface of optoelectronic chip 11 and of the dielectric areas at the surface of interposer 12. The bonding of interposer 12 to optoelectronic chip 11 may be performed by a thermocompression method where optoelectronic chip 11 is placed against interposer 12, and a pressure and a heating are applied.

FIG. 8J shows the structure obtained after having removed substrate 67 to expose surface 15 of semiconductor layer 18. When substrate 67 is made of a semiconductor material, substrate 67 may be removed by a planarization step, such as a chem.-mech. polishing (CMP), and/or an etch step, such as a RIE etching. When substrate 67 is made of an insulating material such as sapphire, substrate 67 may be removed by laser ablation. A step of forming raised patterns on surface 15 may be provided. After the thinning step, the thickness of optoelectronic chip 11 may be in the range from 100 nm to 50 μm, preferably from 1 μm to 30 μm, for example, approximately 10 μm.

FIG. 8K illustrates a step of manufacturing cap 14 and shows the structure obtained after having etched, in a substrate 80, blind openings 82 which are intended to be placed opposite light-emitting diodes 16 and after having covered the lateral walls of openings 82 with reflective coating 44, for example, an aluminum film. The dimensions of openings 82 correspond to the desired dimensions of semiconductor nanocrystal blocks 40. Reflective coatings 44 may be formed by the deposition of a metal layer over the entire substrate 80 and an anisotropic etching of the metal layer, to only keep metal coating 44 on the lateral walls of openings 82. Cap 14 may be formed independently from the previously-described steps. The initial thickness of cap 14 may be greater than or equal to 100 μm, for example, in the range from 100 μm to 5 cm. As a variation, openings 82 may be through openings.

FIG. 8L shows the structure obtained after having formed blocks 40 of semiconductor nanocrystals in at least some of openings 82 and after having bonded substrate 80 to optoelectronic chip 11. Photoluminescent blocks 40 may be formed by filling certain openings 82 with a photoluminescent material. The photoluminescent material may comprise a matrix having photoluminescent particles dispersed therein. The method of forming blocks 40 may correspond to a so-called additive method, for example, by direct printing of the photoluminescent material at the desired locations, for example, by inkjet printing, photogravure, silk-screening, flexography, spray coating, or drop casting. The photoluminescent material matrix may be a resin which is polymerized after the photoluminescent material has been deposited by printing. As an example, the polymerization of the matrix may be obtained by exposing photoluminescent blocks 40 to an electromagnetic radiation, particularly an ultraviolet radiation. The bonding of substrate 80 to optoelectronic chip 11 may be performed by direct bonding or by thermocompression.

In the case where the photoluminescent material is not the same for all photoluminescent blocks 40, the filling of openings 82 may be carried out in a plurality of successive steps, at each step, openings 82 being filled with a photoluminescent material while the other openings are masked with resin.

FIG. 8M shows the structure obtained after a step of thinning interposer 12 and a step of forming conductive portions 46 on the surface of interposer 12 opposite to optoelectronic chip 11. The thickness of interposer 12 after the thinning step is smaller than or equal to 150 µm, preferably in the range from 1 µm to 150 µm, more preferably in the range from 10 µm to 100 µm, for example, approximately 30 µm. The mechanical resistance of the structure is then at least partly ensured by cap 14.

FIG. 8N shows the structure obtained after a step of thinning substrate 80, from the side of substrate 90 opposite to light-emitting diodes 16, to expose blocks 40 of semiconductor nanocrystals. The thinning may be performed by chem.-mech. polishing. Cap 14 may comprise a transparent plate, for example, a glass plate. The thickness of cap 14, comprising the possible transparent plate, is greater than or equal to 100 µm after the thinning step.

The next step of the method comprises sawing the structure shown in FIG. 8N, for example, along lines 84. The monolithic devices obtained after sawing then each have the structure shown in FIG. 1.

According to another embodiment, photoluminescent blocks 40 are formed after the step of bonding cap 14 to optoelectronic chip 11 and the step of thinning cap 14 where recesses 82 become through openings.

The previously-described embodiments of the optoelectronic device manufacturing method have the advantage of not requiring the use of a temporary handle for the manipulation of the integrated circuit chips. There thus is no step of removal of a temporary handle. Further, interposer 12 may be bonded to a support, for example, by a "Flip-Chip"-type bonding. The electric connection of interposer 11 may be implemented without using connection wires.

FIGS. 9A to 9D are partial simplified cross-section views of structures obtained at successive steps of another embodiment of a method of manufacturing cap 14 of optoelectronic device 65 shown in FIG. 7.

Figure 9A:
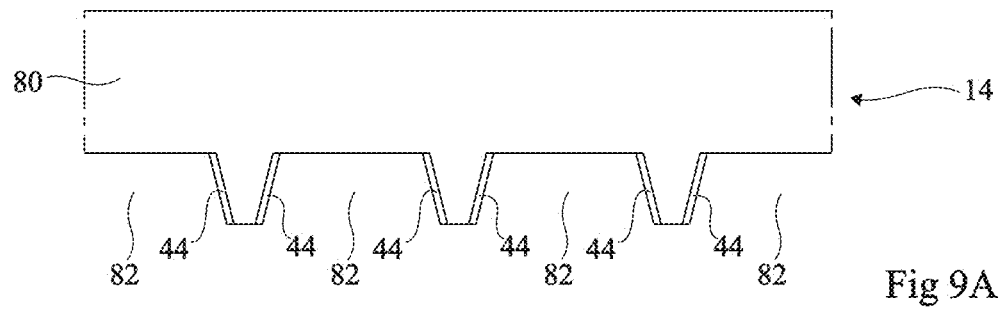
FIGS. 9A to 9D are partial simplified cross-section views of structures obtained at successive steps of another embodiment of a method of manufacturing the optoelectronic device shown in FIG. 7.

FIG. 9A is a drawing similar to FIG. 8K, with the difference that openings 82 have inclined sides.

Figure 9B:
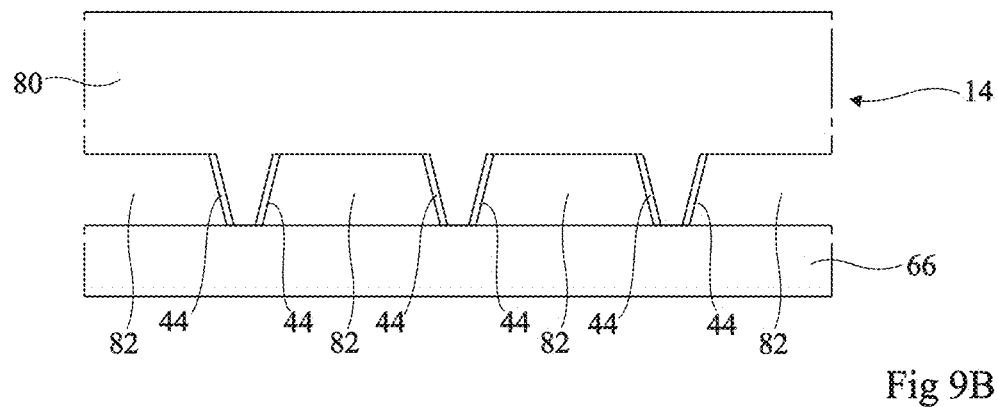

FIG. 9B shows the structure obtained after having bonded transparent plate 66, particularly a glass plate, to substrate 80, on the side of openings 82, for example by electrostatic glass/silicon bonding.

Figure 9C:
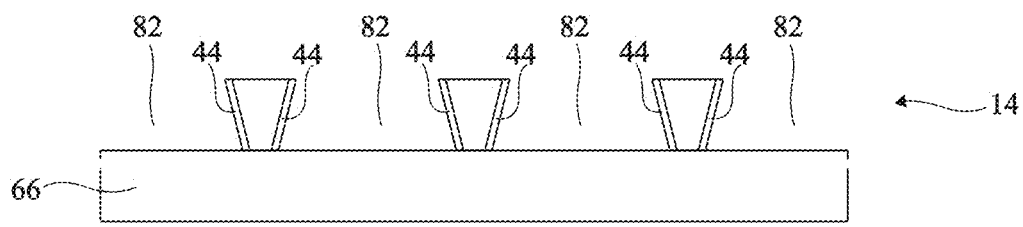

FIG. 9C shows the structure obtained after a step of thinning substrate 80, from the side of substrate 90 opposite to transparent plate 66, to expose openings 82. The thinning may be performed by chem.-mech. polishing. The thickness of cap 14, comprising transparent plate 66, is greater than or equal to 100 µm after the thinning step.

Figure 9D:
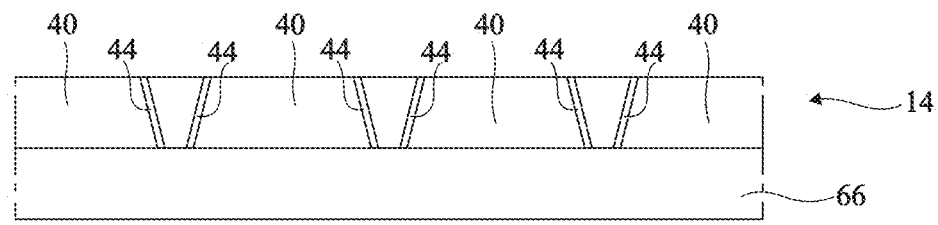

FIG. 9D shows the structure obtained after the filling of openings 82 with a photoluminescent material to form photoluminescent blocks 40. In the case where the photoluminescent material is not the same for all photoluminescent blocks 40, the filling of openings 82 may be carried out in a plurality of successive steps, at each step, openings 82 being filled with a photoluminescent material while the other openings are masked with resin.

The next steps of the method comprise bonding cap 14 to optoelectronic chip 11, for example, as previously described in relation with FIG. 8L, and sawing the obtained structure. The monolithic devices obtained after sawing then each have a cap 14 having the structure shown in FIG. 7.

Specific embodiments have been described. Various alterations, modifications, and improvements will occur to those skilled in the art. In particular, although, in the previously-described embodiments, each optoelectronic chip comprises a single photoluminescent block 40, it should be clear that the optoelectronic device may comprise a plurality of photoluminescent blocks, each photoluminescent block being, for example, opposite a light-emitting diode.

Various embodiments with different variations have been described hereabove. It should be noted that those skilled in the art may combine various elements of these various embodiments and variations without showing any inventive step. In particular, the structure shown in FIG. 6, where the electric connection between interposer 12 and another electronic device is performed on surface 62 of interposer 12 in contact with optoelectronic chip 11, may be implemented with the other embodiments of optoelectronic chip 10, 50, 55, 58, 60, and 65 described in relation with FIGS. 1, 2, 3, 4, 5, and 7. Further, the structure shown in FIG. 7 where cap 14 comprises a transparent plate 66 may be implemented with the other embodiments of optoelectronic chip 10, 50, 55, 58, 60, and 64 described in relation with FIGS. 1, 2, 3, 4, 5, and 6.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing optoelectronic devices comprising light-emitting diodes, comprising the steps of:
   a) forming a first integrated circuit chip comprising light-emitting diodes (16);
   b) bonding a second integrated chip to a first surface of the first integrated circuit chip;
   c) decreasing the thickness of the first integrated circuit chip on the side opposite to the first surface to form a second surface opposite to the first surface, the first integrated circuit chip having, after step c), a first thickness in the range from 100 nm to 50 µm;
   d) bonding, to the second surface, a cap comprising a silicon wafer provided with recesses opposite the light-emitting diodes;
   e) decreasing the thickness of the second integrated circuit chip, the second integrated circuit chip having a second thickness smaller than or equal to 150 µm after step e);
   f) decreasing the thickness of the silicon wafer before step d) or after step e), the thickness of the cap being greater than or equal to 100 µm after step f), each recess being filled with a photoluminescent material; and
   g) cutting the structure obtained at step f) into a plurality of separate optoelectronic devices, each comprising at least one of the light-emitting diodes.

2. The method of claim 1, wherein the light-emitting diodes have a mesa structure.

3. The method of claim 1, wherein the recesses are filled with the photoluminescent material before step d).

4. The method of claim 1, wherein the recesses are blind before step f), and are through after step f), the method further comprising the step of filling each recess with the photoluminescent material after step f).

5. The method of claim 1, wherein steps b), c), and d) are successive.

6. The method of claim 1, wherein step a) comprises the forming of the light-emitting diodes on a substrate and step c) comprises the partial or total removal of the substrate.

7. The method of claim 1, wherein the second integrated circuit chip is bonded to the first integrated circuit chip by direct bonding and is electrically connected to the light-emitting diodes.

* * * * *